United States Patent [19]

Kosuda et al.

[11] Patent Number: 6,103,330
[45] Date of Patent: Aug. 15, 2000

[54] OPTICAL RECORDING MEDIUM AND FABRICATION METHOD THEREFOR

[75] Inventors: Masanori Kosuda; Hajime Utsunomiya; Hiroshi Shingai; Takuya Tsukagoshi, all of Nagano, Japan

[73] Assignee: TDK Corporation, Tokyo, Japan

[21] Appl. No.: 09/075,846

[22] Filed: May 12, 1998

[30] Foreign Application Priority Data

May 26, 1997 [JP] Japan .................................. 9-151560

[51] Int. Cl.$^7$ ........................................................ B32B 3/00
[52] U.S. Cl. ...................... 428/64.1; 428/64.4; 428/64.5; 428/913; 430/270.13; 430/945; 369/283; 369/288
[58] Field of Search ................................. 428/64.1, 64.4, 428/64.5, 913; 430/270.13, 495.1, 945; 369/283, 288

[56] References Cited

U.S. PATENT DOCUMENTS

| | | | |
|---|---|---|---|
| 5,271,978 | 12/1993 | Vazan | 428/64.1 |
| 5,688,574 | 11/1997 | Tamura et al. | 428/64.1 |
| 5,891,542 | 4/1999 | Tominaga et al. | 428/64.1 |
| 5,906,874 | 5/1999 | Takahashi et al. | 428/64.1 |

FOREIGN PATENT DOCUMENTS

| | | |
|---|---|---|
| 4-232779 | 8/1992 | Japan . |
| 6-166268 | 6/1994 | Japan . |
| 9-30124 | 2/1997 | Japan . |

*Primary Examiner*—Elizabeth Evans
*Attorney, Agent, or Firm*—Laubscher & Laubscher; R. J. Lasker, Esq.

[57] ABSTRACT

The invention provides a method of fabricating an optical recording medium comprising a phase change type recording layer containing at least one element selected from In, Ag, Te and Sb. The recording layer is formed by a sputtering technique wherein sputtering is carried out while an inert gas and an oxygen gas are introduced in a vacuum chamber in a sputtering system, so that the number of overwritable cycles can be increased by simple means.

4 Claims, 2 Drawing Sheets

OPTICAL RECORDING MEDIUM AND FABRICATION METHOD THEREFOR

BACKGROUND OF THE INVENTION

The present invention relates to a phase change type optical recording medium, and its fabrication method.

Highlight is recently focused on optical recording media capable of recording information at a high density and erasing the recorded information for rewriting or overwriting. One typical rewritable optical recording medium is of the phase change type wherein the recording layer is irradiated with laser beam to change its crystallographic state whereupon a change of reflectance by the crystallographic change is detected for reading. Optical recording media of the phase change type are of great interest since they can be overwritten by modulating the intensity of a single light beam and the optical system of the drive unit used for their operation is simpler as compared with magneto-optical recording media.

Most optical recording media of the phase change type use chalcogenides such as Ge—Te base materials which provide a substantial difference in reflectance between crystalline and amorphous states and have a relatively stable amorphous state.

In recent years, it has also been proposed to use compounds known as chalcopyrites.

Chalcopyrite compounds are extensively investigated as compound semiconductor materials, and applied to solar batteries and the like. The chalcopyrite compounds are composed of Ib-IIIb-VIb$_2$ or IIb-IVb-Vb$_2$ as expressed in terms of the Groups of the Periodic Table and have two stacked diamond structures. The structure of chalcopyrite compounds can be readily determined by X-ray structural analysis and their basic characteristics are described in Physics, Vol. 8, No. 8 (1987), page 441, Denki Kagaku (Electrochemistry), Vol. 56, No. 4 (1988), page 228, and other literature.

Among the chalcopyrite compounds, AgInTe$_2$ is known to be applicable as a recording material by diluting it with antimony or Sb or bismuth or Bi. The resulting optical recording media are generally operated at a linear velocity of about 7 m/s. See JP-A's 3-240590, 3-99884, 3-82593, 3-73384 and 4-151286.

In addition to these phase change type optical recording media using chalcopyrite compounds, JP-A's 4-267192, 4-232779 and 6-166268 disclose phase change type optical recording media wherein an AgSbTe$_2$ phase forms upon the crystallization of a recording layer.

When information is recorded on a phase change type optical recording medium, the recording layer is irradiated with laser beam of power (recording power) high enough to bring the recording layer to a temperature higher than the melting point thereof. The recording layer is melted at spots with the recording power applied thereon, and then clickly cooled so that recorded marks of amorphous nature can be formed. When the recorded marks are erased, on the other hand, the recording layer is irradiated with laser beam having such a relatively low power (erasing power) as to bring the temperature of the recording layer to a temperature higher than that the crystallization temperature thereof but lower than the melting point thereof. The recorded marks with the erasing power applied thereon go back to the amorphous state because they are slowly cooled down after heated to the temperature higher than their crystallization temperature. Thus, if the recording power and erasing power are applied on the recording layer while the intensity of the single light beam is modulated, it is then possible to achieve overwriting.

As overwriting is repeated, however, the phase change type optical recording medium based on an AgInTe$_2$ or AgSbTe$_2$ system undergoes C/N drops due to a decrease in the rate of erasure and signal degradation such as an increased jitter. This offers another problem; the number of overwritable cycles is limited to about 1,000.

JP-A 9-30124 has proposed a phase change type recording layer which comprises Ag, In, Sb and Te as primary components, and has a nitrogen content of 1 to 3 at % and an oxygen content of up to 3 at %. Therein it is stated that the advantage of the invention is that the degradation of C/N due to repeated overwriting can be reduced by preventing incorporation of oxygen in the recording layer. For means for reducing the content of oxygen in the recording layer, the publication refers to backing a plastic substrate, allowing a plastic substrate to stand alone in vacuum before the formation of the recording layer, etching a plastic substrate surface by sputtering, reducing the partial pressure of oxygen during the formation of the recording layer to $2\times10^{-2}$ Pa or lower, and reducing the amount of oxygen in a sputtering target material used for the formation of the recording layer to 500 ppm or lower. In the example therein, it is stated that the greatest number of overwriting cycles is 70,000. However, the publication is silent about the criterion of in what cycles overwriting becomes impossible.

According to the results of experimentation conducted by the inventors, however, it is found that when the recording layer is formed by the method disclosed in JP-A 9-30124, the number of overwritable cycles is barely about 1,000, and so is little improved over that achieved so far in the art. It is here to be noted that by the number of overwritable cycles is intended the number of overwriting cycles at which the jitter is within 13%, as will be described later.

Furthermore, the means used therein for reducing the content of oxygen in the recording layer incur increases in the number of steps involved, production time, and target material cost. Thus, such means are not preferable because difficulty is experienced in producing the recording layer at low costs.

SUMMARY OF THE INVENTION

A primary object of the present invention is to provide a phase change type recording layer in which the number of overwritable cycles can be increased by simple means.

Such an object is achieved by the inventions defined below as (1) to (5).

(1) A method of fabricating an optical recording medium comprising a phase change type recording layer on a substrate, said recording layer containing at least one element selected from the group consisting of indium, silver, tellurium, and antimony, wherein:

said recording layer is formed by a sputtering technique in which sputtering is carried out while an inert gas and an oxygen gas are introduced into a vacuum chamber of a sputtering system.

(2) The method of (1), wherein said sputtering is carried out while said inert gas and said oxygen gas are introduced in said vacuum chamber at such a rate that a ratio of a flow rate of said oxygen gas with respect to a flow rate of said inert gas plus the flow rate of said oxygen gas is between 2% and 10%.

(3) An optical recording medium comprising a phase change type recording layer on a substrate, said recording layer containing at least one element selected from the group consisting of indium, silver, tellurium, and antimony, wherein:

said recording layer has an average oxygen content of 5 to 20 at % between $T_{Te}$ and $T_{Sb}$ on a chart with etching time as abscissa and at % as ordinate, on said chart there are plotted results of measurement of a distribution of elements in a thickness-wise direction of said recording layer, said measurement being made by Auger electron spectroscopy using an electron gun at an acceleration voltage of 5 kV and an angle of incidence of electrons of 20° and an ion gun at an acceleration voltage of 2 kv and an angle of incidence of ions of 60° during argon ion etching, $T_{Te}$ representing an etching time at which a tellurium content reaches a maximum, and $T_{Sb}$ representing an etching time at which an antimony content reaches a maximum.

(4) The optical recording medium of (3), wherein an atomic ratio of elements contained in said recording layer with the exception of oxygen is given by formula I:

$$[(In_aAg_bTe_{1-a-b})_{1-c}Sb_c]_{1-d}M_d \qquad (I)$$

where M is at least one element selected from the group consisting of hydrogen, silicon, carbon, vanadium, tungsten, tantalum, zinc, titanium, cerium, terbium and yttrium, and a=0.1 to 0.3 b=0.1 to 0.3 c=0.5 to 0.8 d=0 to 0.05

(5) The optical recording medium of (3) or (4) fabricated by the fabrication method of (1) or (2).

To increase the number of overwritable cycles in a phase change type recording layer based on an In—Ag—Te—Sb system, it would have been important to eliminate oxygen from the recording layer as by keeping the partial pressure of oxygen in a film forming atmosphere low when the recording layer is formed by sputtering, as described in the aforesaid JP-A 9-30124.

However, the inventors have been found that if a phase change type recording layer based on an In—Ag—Te—Sb system is formed by a sputtering technique while, in addition to an inert gas such as Ar, an oxygen gas is introduced in a vacuum chamber, it is then possible to achieve some considerable increase in the number of overwritable cycles. While the reason that the introduction of the oxygen gas in the film forming atmosphere contributes to a striking increase in the number of overwritable cycles has yet to be clarified, a possible explanation could be that the segregation of the recording layer and the diffusion of elements from the dielectric layer into the recording layer, both due to repeated overwriting, are inhibited.

To reduce the amount of oxygen in the recording layer according to the teachings set forth in JP-A 9-30124, it is required to make use of various procedures that incur some considerable expenses. Indeed, the recording layer that is alleged in the example therein to be capable of standing up to 70,000 overwriting cycles unavoidably entails an increasing fabrication cost, because it is required to bake and etch a substrate, and use a target material having an oxygen content of 400 ppm as well. This is in sharp contrast to the present invention wherein only the introduction of the oxygen gas in the vacuum chamber in the sputtering system is needed, resulting in no substantial fabrication cost increase.

In Example 1, JP-A 9-30124 alleges that an AgInSbTe film is formed by sputtering at a pressure of $1 \times 10^{-1}$ Pa regulated by the introduction of Ar at 110 sccm and $N_2$ at 2 sccm while the partial pressure of oxygen is kept at $1 \times 10^{-2}$ Pa. However, it would had been difficult to achieve such a high partial pressure of oxygen of $1 \times 10^{-2}$ Pa by ordinary vacuum drawing means. If an initial partial pressure of oxygen had have such a high value, the partial pressure of oxygen would be much lower than $1 \times 10^{-2}$ Pa during the formation of the AgInSbTe film, because only the combination of Ar and $N_2$ was introduced with no admission of $O_2$ during sputtering. From the fact that the AgInSbTe film formed in Example 1 has an oxygen content as low as 1 at %, too, the partial pressure of oxygen would be lower than $1 \times 10^{-2}$ Pa during sputtering.

BRIEF DESCRIPTION OF THE DRAWINGS

These and further features of the present invention will be apparent with reference to the following description and drawings, in which.

EMBODIMENTS OF THE INVENTION

Some preferable embodiments of the present invention will now be explained at great length.

Figure 1:
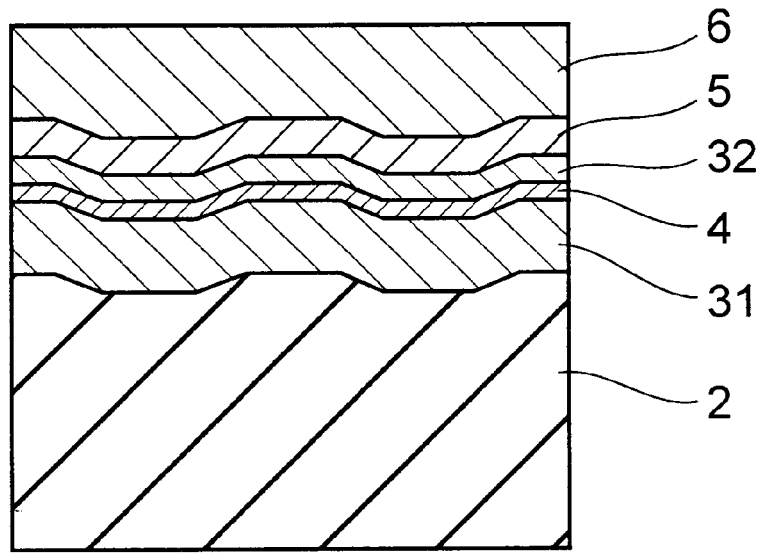
FIG. 1 is a fragmentary sectional schematic illustrative of one embodiment of the optical recording medium according to the present invention.

Optical Recording Medium of FIG. 1

One exemplary architecture of the optical recording medium to which the invention is applicable is shown in FIG. 1. As shown, this optical recording medium is a one side recording (single substrate) type medium which comprises a substrate 2, and a first dielectric layer 31, a recording layer 4, a second dielectric layer 32, a reflective layer 5 and a protective layer 6 provided on a front surface side thereof in the described order. The present invention is also applicable to a double side recording type medium comprising two such single side recording type media which are bonded together at protective layers 6 through adhesive layers. Furthermore, the present invention is applicable to a medium wherein the aforesaid one side recording type medium is bonded to a protective substrate through an adhesive layer.

Recording Layer 4

The recording layer is a phase change type recording layer based on an In—Ag—Te—Sb system containing at least indium or In, silver or Ag, tellurium or Te and antimony or Sb as main components.

The recording layer is formed by a sputtering process. In the invention, the recording layer is formed while an oxygen gas is introduced together with an inert gas in a vacuum chamber in a sputtering system. For the inert gas it is preferable to use argon or Ar, krypton or Kr, xenon or Xe, etc., and especially Ar.

During sputtering, the ratio of the flow rate of the oxygen gas with respect to the flow rate of the inert gas plus the flow rate of the oxygen gas is preferably between 2% and 10%, and more preferably between 4% and 8%. When the flow rate of the oxygen gas is relatively too low, the advantages of the invention are unachievable. When the flow rate of the oxygen gas is relatively too high, C/N and other initial properties become worse because no sufficient degree of modulation is obtainable due to a decrease in the rate of erasure and a low rate of reflectance change incidental to phase changes.

It is here to be noted that sputtering is usually carried-out at a pressure of 0.1 to 1.0 Pa, and preferably 0.1 to 0.5 Pa.

For sputtering, only one alloy target may be used. Alternatively, multiple sputtering may be carried out using a plurality of pure metal or alloy targets.

The thus formed recording layer has an oxygen content of preferably 5 to 20 at %, and more preferably 8 to 17 at %. At too low an oxygen content the advantages of the invention are unachievable, whereas at too high an oxygen content C/N becomes worse.

In the practice of the invention, the content of oxygen in the recording layer is measured by Auger electron spectroscopy using an electron gun at an acceleration voltage of 5 kV and an angle of incidence of electrons of 20° (an angle that the direction of incidence of electrons makes with the normal of a sample surface), and an ion gun at an acceleration voltage of 2 kV and an angle of incidence of ions of 60° (an angle that the direction of incidence of ions makes with the normal of a sample surface) during Ar ion etching.

It is here to be noted that the Auger electron spectroscopy does not provide any intermediate value for the content of each element; it is required to regulate a sensitivity coefficient for each element. In the practice of the invention, it is required to regulate the sensitivity coefficient for In, Ag, Te, and Sb in such a manner as to obtain the same value as that obtained by analyzing the recording layer by ICP (inductively coupled plasma spectroscopy). For oxygen, too, it is required to regulate sensitivity coefficient using a $Cu_2O$ standard sample.

Figure 3:
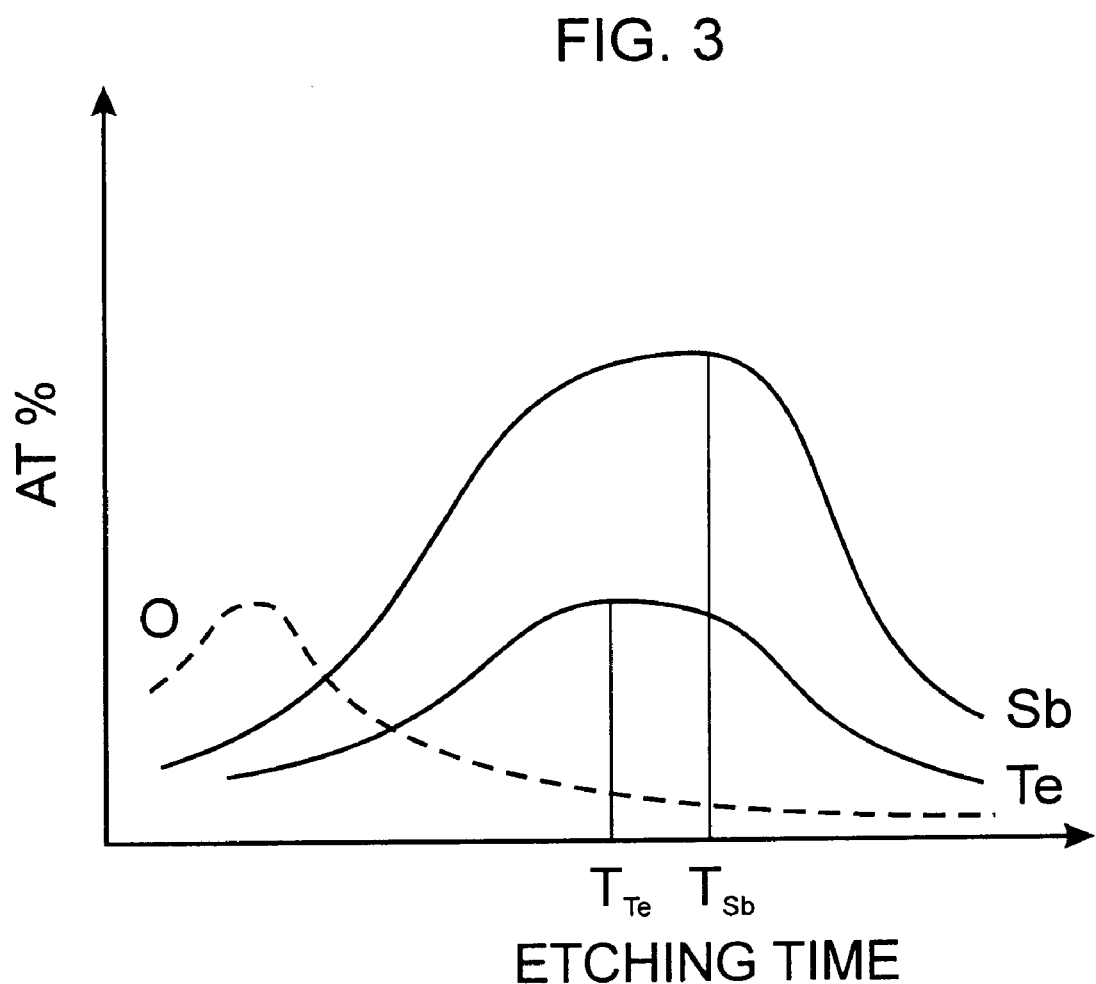
FIG. 3 is a schematic chart on which the results of measurement of a distribution of elements in the vicinity of the recording layer by Auger electron spectroscopy are plotted.

Then, the obtained measurements are plotted on a chart with etching time as abscissa and at % as ordinate, as can be seen from FIG. 3. From this chart, an etching time $T_{Te}$ at which the Te content reaches a maximum and an etching time $T_{Sb}$ at which the Sb content reaches a maximum are found. To determine the content of oxygen in the recording layer according to the invention, an average oxygen content between $T_{Te}$ and $T_{Sb}$ (an average value of all measured data) is found. When measured by Auger electron spectroscopy, $T_{Te}$ and $T_{Sb}$ do not usually coincide with each other, as shown in FIG. 3; in other words, it appears that Te and Sb have not actually such concentration distributions as shown in a thickness-wise direction of the recording layer.

In the invention, the atomic ratio of elements in the recording layer with the exception of oxygen is not critical; however, it is given by formula I:

$$[(In_aAg_bTe_{1-a-b})_{1-c}Sb_c]_{1-d}M_d \qquad (I)$$

Preferably, the letters a, b, c and d fall in the ranges:
a=0.1 to 0.3
b=0.1 to 0.3
c=0.5 to 0.8
d=0 to 0.05
More preferably, the letters a, b, c and d fall in the ranges:
a=0.11 to 0.28
b=0.15 to 0.28
c=0.55 to 0.78
d=0.005 to 0.05

When the value of a in formula I is too small, the In content of the recording layer becomes relatively too small. This in turn makes the amorphism of recorded marks insufficient, resulting in a drop of the degree of modulation, and a reliability drop as well. At too large a value of a, on the other hand, the In content of the recording layer becomes relatively too high. This in turn makes the reflectance of an area other than a recorded mark area low, resulting in a drop of the degree of modulation.

When the value of b in formula I is too small, the Ag content of the recording layer becomes relatively too low. This in turn makes the recrystallization of recorded marks difficult and so renders repeated overwriting difficult. At too large a value of b, on the other hand, the Ag content of the recording layer becomes relatively high, and so excessive Ag diffuses independently into an Sb phase at the time of recording or erasure. This in turn makes the robustness of the recording layer upon rewriting low, and renders the stability of both recorded marks and crystalline portions low, resulting a reliability drop. In other words, the crystallization of the recorded marks is promoted during storage at high temperatures, often resulting in drops of C/N and degree of modulation. Repetition of recording may often facilitate deterioration of C/N and degree of modulation.

When the value of a+b is too small, a Te phase is formed by excessive Te. The Te phase makes erasure difficult because it slows down the rate of crystal transition. When the value of a+b is too large, on the other hand, it is difficult to make the recording layer amorphous, leading to a possibility that signals may not be recorded.

When the value of c in formula I is too small, there is an increased reflectance difference concomitant with a phase change, but difficulty is involved in erasure because of an abrupt crystal transition rate drop. At too large a value of c, on the other hand, there is a decreased degree of modulation due to a decreased reflectance difference incidental to the phase change.

In formula I, the element M represents at least one element selected from the group consisting of hydrogen or H, silicon or Si, carbon or C, vanadium or V, tungsten or W, tantalum or Ta, zinc or Zn, titanium or Ti, cerium or Ce, terbium or Tb and yttrium or Y. The element M is effective for improving rewriting robustness, and more specifically reducing the drop of the rate of erasure due to repeated rewriting, and contributes to a reliability improvement under unfavorable conditions, e.g., high temperature and humidity conditions. Of these elements, it is preferable to use at least one of V, Ta, Ce and Y because their such effects are strong. Particular preference is given to at least one of V and Ta, with V being most preferred.

When the value of d representing the content of the element M is too large, no sufficient degree of modulation is obtainable because of a decreased reflectance difference concomitant with a phase change. When the value of d is too small, the effect of the element M added becomes slender.

It is preferred that the recording layer based on this composition consists essentially of Ag, Sb, Te and In, and the element or elements M added if required. In the practice of the present invention, however, it is acceptable that the silver may be partially replaced by gold or Au, the antimony may be partially replaced by bismuth or Bi, the tellurium may be partially replaced by selenium or Se, and the indium may be partially replaced by aluminum or Al and/or phosphorus or P.

The percent replacement of Ag by Au is preferably up to 50 at %, and more preferably up to 20 at %. At too high a percent replacement, recorded marks are susceptible to crystallization, leading to a reliability drop at high temperatures.

The percent replacement of Sb by Bi is preferably up to 50 at %, and more preferably up to 20 at %. Too high a percent replacement causes the recording layer to have an increased coefficient of absorption, resulting in a reduction of the interference effect of light. This in turn makes the reflectance difference between crystalline and amorphous portions and hence the degree of modulation low, so failing to obtain high C/N.

The percent replacement of Te by Se is preferably up to 50 at %, and more particularly up to 20 at %. Too high a percent replacement causes the rate of crystal transition to become too low to obtain any sufficient rate of erasure.

The percent replacement of In by Al and/or P is preferably up to 40 at %, and more preferably up to 20 at %. Too high a percent replacement causes the stability of recorded marks to become low with a reliability drop. It is noted that Al and P may be used at any desired proportion.

The recording layer has a thickness of preferably 9.5 to 50 nm, and more preferably 13 to 30 nm. Too thin a recording layer makes the growth of a crystalline phase difficult, and so renders a reflectance change incidental to a phase change insufficient. Too thick a recording layer, on the other hand, causes a large amount of silver to diffuse in the recording layer in a thickness-wise direction thereof during the formation of recorded marks. This in turn makes the proportion of silver diffusing in a longitudinal direction of the recording layer low, resulting in a drop of the reliability of the recording layer.

The composition of the recording layer may be determined by EPMA, X-ray microanalysis, ICP, or the like.

Dielectric Layers 31 and 32

The first dielectric layer 31 is provided to prevent oxidation of the recording layer, and protect the substrate by cutting off heat that may otherwise be conducted from the recording layer to the substrate during recording. The second dielectric layer 32 is provided to protect the recording layer, and escape the heat remaining in the recording layer after the completion of recording. Both the dielectric layers also contribute to an improved degree of modulation.

For the dielectric materials used for the first and second dielectric layers, it is preferable to use various transparent ceramics such as silicon oxide, silicon nitride, and ZnS—$SiO_2$, although the invention is not limited thereto. Various glasses, and so-called LaSiON containing La, Si, O and N and so-called SiAlON containing Si, Al, O and N with or without Y are also preferably used.

In accordance with the invention, at least one of the first and second dielectric layers contains zinc sulfide to optimize properties such as the index of refraction. In the present disclosure, the zinc sulfide-containing dielectric layer will hereinafter be referred to as the ZnS-containing dielectric layer. In the practice of the invention, the ZnS-containing dielectric layer preferably contains an element (hereinafter called a metal element A) that has a standard free energy for the formation of a sulfide thereof lower than a standard free energy for the formation of ZnS at 0 to 1,000° C. By incorporating metal element A in the ZnS-containing dielectric layer, it is possible to prevent sulfur release upon repeated overwriting cycles, thereby preventing jitter increases and making it possible to increase the number of overwritable cycles.

For the metal element A, it is preferable to use at least one element selected from the group consisting of cerium or Ce, calcium or Ca, magnesium or Mg, strontium or Sr, barium or Ba, and sodium or Na, with Ce being most preferable because of its low standard free energy for the formation of its sulfide. At 300° K, for instance, the standard free energy is ca. −230 kJ/mol for the formation of ZnS, ca. −540 kJ/mol for the formation of CeS, ca. −510 kJ/mol for the formation of CaS, ca. −390-kJ/mol for the formation of MgS, ca. −500 kJ/mol for the formation of SrS, ca. −460 kJ/mol for the formation of BaS, and ca. −400 kJ/mol for the formation of $Na_2S$.

In the ZnS-containing dielectric layer, the ratio of metal element A to all metal elements is less than 2 at %, preferably up to 1.5 at %, and more preferably up to 1.3 at %. Too much metal element A is substantially ineffective for prevention of jitter increases upon repeated overwriting cycles. To take full advantage of the effect of metal element A added, it is preferred that the proportion of metal element A is particularly at least 0.01 at %, and more particularly at least 0.03 at %. The ratio of metal element A to all metal elements may be determined by fluorescent X-ray analysis, EPMA (electron probe X-ray microanalysis), or the like. In the present disclosure, all metals in the dielectric layer are understood to include metalloids such as Si.

In the dielectric layer, metal element A may be present in the form of any of a single substance, sulfide, oxide, fluoride, etc.

Preferably, the ZnS-containing dielectric layer contains, in addition to zinc sulfide, for instance, oxides, nitrides, and fluorides. Such compounds, for instance, include silicon oxides ($SiO_2$, SiO), tantalum oxide ($Ta_2O_5$), titanium oxide ($TiO_2$), lanthanum oxide ($La_2O_3$), silicon nitride ($Si_3N_4$), aluminum nitride (AlN), magnesium fluoride ($MgF_2$), sodium fluoride (NaF), and thorium fluoride ($ThF_4$), at least one of which is preferably used in the practice of the present invention. A dielectric layer, when substantially formed of zinc sulfide alone, becomes too hard, and so suffers from delamination due to thermal shocks produced upon repeated overwriting cycles, resulting in a robustness drop. By incorporating silicon oxide or nitride in the dielectric layer, however, it is possible to achieve an improvement in robustness upon overwriting.

The zinc sulfide content of the ZnS-containing dielectric layer is preferably 50 to 95 mol %, and more preferably 70 to 90 mol %. Too little ZnS makes the thermal conductivity of the dielectric layer too high and the refractive index thereof too low to achieve high C/N. Too much, on the other hand, detracts from robustness upon overwriting. The ZnS content of the dielectric layer may be determined on the basis of the quantity of sulfur and the quantity of zinc found by fluorescent X-ray analysis or the like. When, for instance, zinc is in excess of sulfur, excessive zinc is supposed to exist in the form of other compound, e.g., ZnO.

While an account has been given of a specific arrangement wherein the ZnS-containing dielectric layer contains metal element A, it is understood that an intermediate layer containing metal element A may be interleaved between the ZnS-containing dielectric layer and the recording layer. Such an intermediate layer, for instance, may be made up of cerium oxide ($CeO_2$) alone or a ZnS—$CeO_2$ mixture.

When only one of the first and second dielectric layers is used in the form of the ZnS-containing dielectric layer, the other or ZnS-free dielectric layer is made up of any desired dielectric material, preferably but not exclusively, one of the aforesaid dielectric materials with the exception of ZnS.

Preferably, the first and second dielectric layers have a refractive index of at least 1.4, and especially at least 1.8 in the wavelength range of 400 to 850 im. In this regard, the aforesaid wavelength range includes a wavelength 780 nm at which state-of-the-art CD players are used, and wavelengths 630–680 nm which are a candidate for the next-generation wavelengths now under development. The optical recording media of the present invention are preferably used in such a wavelength range.

The first dielectric layer 31 has a thickness of preferably 30 to 300 nm, and more preferably 50 to 250 nm. By allowing the first dielectric layer to have such a thickness, it is possible to ensure effective prevention of damage to the substrate upon recording, and to increase the degree of modulation as well. The second dielectric layer 32 has a thickness of preferably 10 to 30 nm, and more preferably 13 to 20 nm. By allowing the second dielectric layer to have such a thickness, it is possible to ensure a fast cooling rate, and hence to clearly delimit the edges of recorded marks, resulting in reduced jitters. Such a thickness also results in an increased degree of modulation.

Each dielectric layer is preferably formed by vapor phase growth processes such as sputtering, and evaporation. The incorporation of metal element A in the dielectric layer may be achieved by various processes. When, for instance, cerium is used as metal element A, the target used may comprise a major target providing a major component of the dielectric layer, on which a chip composed of cerium alone or $CeO_2$ is placed. Alternatively, $CeO_2$ or other cerium compound may be incorporated in the major target. In another target embodiment wherein calcium or magnesium is used as metal element A, a chip composed of CaO or MgO may be placed on the aforesaid major target to form a target. However, this embodiment is not preferable because of the deliquescence of such compounds. Preferably in this case, therefore, a chip composed of $CaF_2$ or $MgF_2$ is placed on the major target to form a target. When strontium, barium or sodium is used as metal element A, too, it is preferable to use a fluoride chip rather than an oxide chip in view of deliquescence. Calcium, magnesium, strontium, barium, and sodium may be incorporated in the major target in the form of an oxide or other compound. It is here to be noted that a composite target such as $ZnS$—$SiO_2$ may be used for the major target, or use may be made of a multiple target process wherein ZnS, and $SiO_2$ are independently used as the major target.

The ZnS-containing dielectric layer may be formed by ordinary sputtering processes in an argon atmosphere, but it is preferable to carry out sputtering in an $Ar/O_2$ mixed atmosphere, when the aforesaid metal element A is incorporated therein. By performing sputtering in such a mixed atmosphere, it is possible to enhance the effect on reducing a jitter increase upon repeated overwriting cycles. The introduction of $O_2$ at the time of sputtering is particularly effective for carrying out sputtering while a chip composed of metal element A alone is placed on the major target. This is also effective for the cases where a chip composed of a compound of metal element A is placed on the major target, and a compound of metal element A is incorporated in the major target. When the amount of $O_2$ incorporated in the sputtering atmosphere is represented by a flow rate ratio $O_2/(Ar+O_2)$, it is preferable that the flow rate ratio is particularly up to 30%, and more particularly up to 25%. The incorporation of too much $O_2$ is not preferable although it is possible to lower recording power. This is because the margin of erasing power becomes extremely narrow due to the erasing power remaining unchanged. It is here noted that in order to take full advantage of the effect of $O_2$ introduced, the aforesaid flow rate ratio is preferably at least 5%, and more preferably at least 10%.

Reflective Layer 5

Preferably but not exclusively, the reflective layer is formed of any desired material, usually any of high-reflectance metals or alloys of such metals, for instance, Al, Au, Ag, Pt, and Cu, and has preferably a thickness of 30 to 200 nm. At a thickness less than the lower limit of this range, it is difficult to obtain any sufficient reflectance. A thickness exceeding the upper limit of the range provides no further improvement in reflectance, and is rather unfavorable in view of cost-effectiveness. Preferably, the reflective layer is formed by vapor phase growth processes such as sputtering or evaporation.

Protective layer 6

The protective layer is provided to improve scratch resistance and corrosion resistance. Preferably, this protective layer is formed of various organic materials. However, particular preference is given to constructing the protective layer of a radiation-curing type compound or a composition thereof, which is cured with radiation such as electron beams or ultraviolet radiation. The protective layer has usually a thickness of about 0.1 to 100 $\mu$m, and may be formed by ordinary processes such as spin coating, gravure coating, spray coating, and dipping.

Adhesive Layer

Adhesives forming the adhesive layer are not critical; for instance, a selection may be made from a hot-melt adhesive, an ultraviolet radiation curing adhesive, and a cold setting adhesive. A tackifier may also be used.

Figure 2:
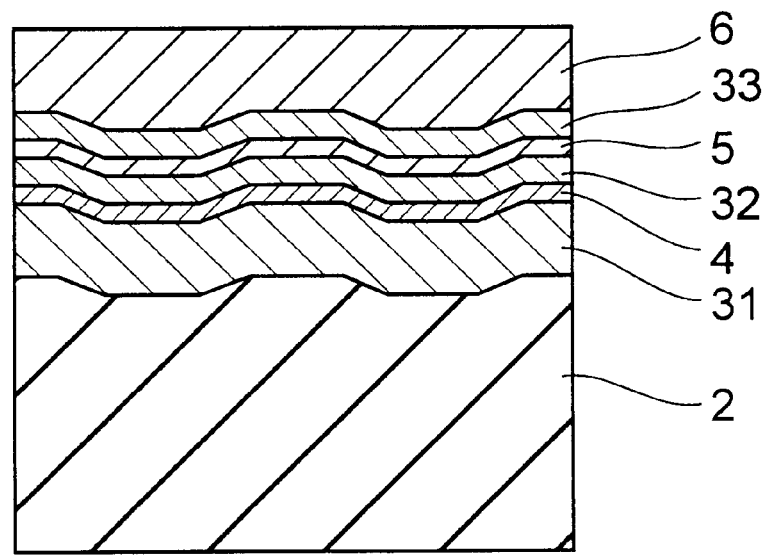
FIG. 2 is a fragmentary sectional schematic illustrative of another embodiment of the optical recording medium according to the present invention.

Optical Recording Medium of FIG. 2

Another exemplary architecture of the optical recording medium to which the invention is applicable is illustrated in FIG. 2. With the optical recording medium of this architecture, it is possible to further reduce jitter increases due to overwriting.

In a phase change type optical recording medium, the absorptance (Ac) of the recording layer at an area (in a crystalline state) other than a recorded mark area is often different from the absorptance (Aa) of the recording layer at the recorded mark area (in a non-crystalline state). In general, Ac<Aa. For this reason, recording sensitivity and the rate of erasure vary largely depending on whether the overwriting area was in the crystalline state or in the non-crystalline state. Consequently, there are variations in the length and width of recorded marks formed by overwriting, which may otherwise result in increased jitters and, hence, errors. Especially when high recording density is achieved by mark edge recording wherein information is born at both ends of a recorded mark, there are even more errors under the possible influence of fluctuations in the length of the recorded mark. To solve this problem, it is required that Ac=Aa, or Ac>Aa if the influence of latent heat is taken into account. This may be achieved by controlling the thickness of the recording layer or the thicknesses of the dielectric layers between which the recording layer is interleaved. If Ac$\geq$Aa is applied to a medium of ordinary structure, another problem then arises; C/N becomes low due to a small difference between the reflectance (Rc) of the medium at an area other than a recorded mark area and the reflectance (Ra) of the medium at the recorded mark area.

Situations being like this, for instance, JP-A 8-124218 has proposed an optical information recording medium comprising a substrate, and a first dielectric layer, a recording layer, a second dielectric layer, a reflective layer, a third dielectric layer and an ultraviolet radiation curing layer stacked thereon in the described order, wherein Ac>Aa, a transmitting super-thin metal film or Si or Ge is used as the reflective layer, and a dielectric material having a refractive index of greater than 1.5 is used as the third dielectric layer. By providing the light transmitting reflective layer and the third dielectric layer having a high refractive index, it is thus possible to increase the Ac/Aa ratio while large Rc-Ra is kept.

The optical recording medium of FIG. 2 includes a reflective layer 5 having the same structure as disclosed in the aforesaid JP-A 8-124218, and a third dielectric layer 33 interleaved between the reflective layer 5 and a protective layer 6. It is here to be noted that a substrate 2, a first dielectric layer 31, a recording layer 4, a second dielectric layer 32 and the protective layer 6 are the same as those in the optical recording medium of FIG. 1.

Referring further to FIG. 2, the reflective layer 5 is preferably made up of a super-thin metal layer having a high light transmittance, or Si, Ge or other material that shows a high transmittance in the near infrared to infrared regions in which recording and reproducing wavelengths are included. The thickness of the reflective layer may be approximately determined in such a way as to make correction for an absorptance difference between an area of the recording layer other than a recorded mark area and the recorded mark area. A preferable thickness range of the reflective layer varies largely depending on the material of which the reflective layer is constructed, and so may be appropriately determined depending on that material. For instance, when a metal such as Au is used for the reflective layer, the reflective layer has a thickness of preferably up to 40 nm, and more preferably 10 to 30 nm. When Si or Ge is used, the reflective layer has a thickness of preferably up to 80 nm, and more preferably 40 to 70 nm. Too thin a reflective layer incurs a C/N drop whereas too large a reflective layer is insufficient to achieve the aforesaid effect on making correction for an absorptance difference.

When the reflective layer is made up of a metal, it is preferable to use Au or an Au alloy. The Au alloy used herein contains Au as a main component and further includes at least one element selected from the group consisting of Al, Cr, Cu, Ge, Co, Ni, Mo, Ag, Pt, Pd, Ta, Ti, Bi and Sb.

This reflective layer, too, is preferably formed by vapor phase growth techniques such as sputtering, and evaporation.

The third dielectric layer 33, which may be provided on the reflective layer 5 if required, is preferably made up of a material having a refractive index higher than that of the protective layer 6. By the provision of such a third dielectric layer, it is possible to increase the aforesaid Ac/Aa while the reflectance difference between a recorded mark area and other area is kept large, as in the case of the invention disclosed in the aforesaid JP-A 8-124218.

The third dielectric layer may be made up of a material selected from the dielectric materials already mentioned with reference to the first and second dielectric layers. However, since the third dielectric layer is in no contact with the recording layer, it is unnecessary to incorporate the aforesaid metal element A therein.

The third dielectric layer has a thickness of preferably 30 to 120 nm, and more preferably 40 to 90 nm. It is here to be noted that too thin a third dielectric layer results in a signal output decrease whereas too thick a third dielectric layer results in a phenomenon called cross erasure, where signals on adjacent tracks are erased.

Rewriting

For rewriting, the optical recording medium of the present invention may be irradiated with light as is the case with the aforesaid conventional phase change type optical recording medium. A pulse form of recording power may be applied on the optical recording medium. If one signal is recorded by at least two exposures to light, the accumulation of heat in recorded marks can then be so reduced that the dilation of the trailing edges of the recorded marks (teardrop phenomena) can be avoided, resulting in an improved C/N.

A pulse form of irradiation of the optical recording medium with light also contributes to an improvement in the rate of erasure. Actual values of recording power and erasing power may be experimentally determined. It is understood that the reading laser beam used should be of such low power that the crystallographic state of the recording layer can remain substantially unaffected.

For recording, the linear velocity of the optical recording medium including the recording layer having the aforesaid composition is usually about 0.8 to 20 m/s, and preferably 1.2 to 16 m/s with respect to laser beam.

Insofar as the optical recording medium of the present invention including the recording layer having the aforesaid composition is concerned, the light used for rewriting or reading may be freely selected from a wide wavelength region, for instance, from the range of 100 to 5,000 nm.

EXAMPLE

The present invention will now be explained more specifically with reference to some examples thereof.

Optical recording disk samples of the architecture shown in FIG. 1 were prepared as follows.

For substrate 2, a disk form of polycarbonate having a diameter of 120 mm and a thickness of 0.6 mm was used.

Substrate 2 was simultaneously provided with grooves (having a width of 0.74 μm and a depth of 65 nm at a pitch of 1.48 μm) by injection molding.

First dielectric layer 31 was formed by a sputtering process in an Ar atmosphere. The flow rate of Ar gas was 75 sccm, the atmosphere pressure was 0.2 Pa, and the input power was 800 W. For a target, ZnS (85 mol %)-SiO$_2$ (15 mol %) was used. The first dielectric layer had a thickness of 220 nm.

Recording layer 4 was formed by a sputtering process. The atmosphere pressure was 0.3 Pa, and the input power was 200 W. A plurality of samples were prepared while the flow rate ratio of O$_2$ to Ar plus O$_2$ for sputtering was varied as shown in Table 1. The content of oxygen in the recording layer corresponding to each flow rate ratio is also shown in Table 1. The oxygen contents reported therein were found by Auger electron spectroscopy under the aforesaid conditions. It is here to be noted that the Auger electron spectroscopy was carried out while etching was performed from the reflective layer side.

The composition in atomic ratio of the recording layer is given by formula I:

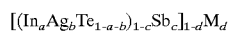

where a=0.129, b=0.177, c=0.651, d=0.015 and M=V. The recording layer had a thickness of 17 nm.

Second dielectric layer 32 was formed as in the case of first dielectric layer 31 with the exception that the flow rate of Ar gas was increased to 80 sccm. The second dielectric layer had a thickness of 15 nm.

Reflective layer 5 was formed in an Ar atmosphere by means of a sputtering process using an Al—Cr alloy target. The flow rate of Ar gas was 100 sccm, the atmosphere pressure was 0.2 Pa, and the input power was 800 W. The reflective layer had a thickness of 100 nm.

Protective layer 6 was formed by coating an ultraviolet radiation curing resin by means of a spin coating process and curing the resin by irradiation with ultraviolet radiation. The post-curing thickness of the protective layer was 5 μm.

Using a measuring device equipped with an optical head having a wavelength of 680 nm and an NA of 0.6, 8–16RLL signals were recorded on each of the thus prepared samples, and the output signals were measured by a time interval analyzer (TIA). It is here to be noted that the optimum linear velocity for each sample was selected from the range of 2 to 6 m/s. Based on the obtained measurements, the jitter was found by σ/Tw (%)

where Tw is a window width. Herein the maximum value of the number of overwriting cycles, at which the jitter is within 13%, is defined as the number of overwritable cycles, as reported in Table 1.

TABLE 1

| Sample No. | Flow Rate Ratio $O_2/(Ar + O_2)$ | Oxygen Content of Recording Layer (at %) | Number of Overwritable Cycles |
|---|---|---|---|
| 1* | 0** | 1.1** | 1,000 |
| 2 | 2 | 5.2 | 5,000 |
| 3 | 4 | 8.3 | 100,000 or greater |
| 4 | 6 | 12.9 | 100,000 or greater |
| 5 | 8 | 17.0 | 100,000 |
| 6 | 10 | 20.0 | 50,000 |
| 7* | 12 | 25.0** | |

*for comparative purposes
**Deviation from the scope of the invention

From Table 1, it is evident that the number of overwritable cycles is much more increased by forming the recording layer by the sputtering process while the given proportion of oxygen gas is introduced together with Ar gas. It is here to be noted that the jitter in sample No. 7 exceeded 13% from the first time.

Using the aforesaid measuring device, the optimum linear velocity was selected from the range of 2 to 6 m/s to record a single signal of 0.65 μm in mark length on each sample. After this signal was overwritten 10 times, C/N was measured by a spectrum analyzer. Sample Nos. 1 to 5 showed high enough C/N. However, sample No. 6 showed somewhat lower C/N. Sample No. 7 produced much noise due to an extremely low rate of erasure, and showed extremely reduced C/N.

Japanese Patent Application No. 9-151560 is herein incorporated by reference.

Although some preferred embodiments have been described, many modifications and variations may be made thereto in the light of the above teachings. It is therefore to be understood that within the scope of the appended claims, the invention may be practiced otherwise than as specifically described.

What we claim is:

1. An optical recording medium comprising a rewritable phase change type recording layer on a substrate, said recording layer containing at least one element selected from the group consisting of indium, silver, tellurium and antimony, wherein:

said recording layer has an average oxygen content of 5 to 20 at % between $T_{Te}$ and $T_{Sb}$ as in FIG. 3, wherein:

the measurement of a distribution of elements in a thickness-wise direction of said recording layer are plotted, $T_{Te}$ representing an etching time at which the tellurium content reaches a maximum, and $T_{Sb}$ representing an etching time at which the antimony content reaches a maximum.

2. The optical recording medium of claim 1, wherein an atomic ratio of elements contained in said recording layer with the exception of oxygen is given by formula I:

$$[(In_a Ag_b Te_{1-a-b})_{1-c} Sb_c]_{1-d} M_d$$

where M is at least one element selected from the group consisting of hydrogen, silicon, carbon, vanadium, tungsten, tantalum, zinc, titanium, cerium, terbium and yttrium, and a=0.1 to 0.3 b=0.1 to 0.3 c=0.5 to 0.8 d=0 to 0.05.

3. An optical recording medium as in claim 1, wherein:

said recording layer is formed by sputtering in an inert gas and oxygen in a vacuum.

4. The optical recording medium of claim 1, wherein said sputtering is carried out while said inert gas and said oxygen gas are introduced in said vacuum chamber at such a rate that a ratio of a flow rate of said oxygen gas with respect to a flow rate of said inert gas plus the flow rate of said oxygen gas is between 2% and 10%.

* * * * *